United States Patent [19]
Warner, Jr. et al.

[11] Patent Number: 4,885,615
[45] Date of Patent: Dec. 5, 1989

[54] MONOCRYSTALLINE THREE-DIMENSIONAL INTEGRATED CIRCUIT

[75] Inventors: Raymond M. Warner, Jr., Edina; Ronald D. Schrimpf, St. Paul, both of Minn.; Alfons Tuszynski, San Diego, Calif.

[73] Assignee: Regents of the University of Minnesota, Minneapolis, Minn.

[21] Appl. No.: 861,708

[22] Filed: May 12, 1986

Related U.S. Application Data

[63] Continuation-in-part of Ser. No. 799,652, Nov. 19, 1985, Pat. No. 4,794,442.

[51] Int. Cl.⁴ .................... H01L 29/80; H01L 27/02; H01L 27/12
[52] U.S. Cl. ........................................ 357/22; 357/41; 357/44; 357/49
[58] Field of Search ................................. 357/41, 22

[56] References Cited

U.S. PATENT DOCUMENTS 4,412,239 10/1983 Iwasaki et al. ................. 357/92
4,500,905 2/1985 Shibata ........................... 357/41
4,638,344 1/1987 Cardwell, Jr. ................... 357/41

Primary Examiner—Rolf Hille
Assistant Examiner—Robert P. Limanek
Attorney, Agent, or Firm—Hugh D. Jaeger

[57] ABSTRACT

A single-crystal monolith containing a 3-D doping pattern forming varied devices and circuits that are junction-isolated. The semiconductor monolith includes interconnecting signal paths and power buses, also junction-isolated, usually with N+ regions within P matrix regions, and tunnel junctions, N+ - P+ junctions, as ohmic contacts from N-type to P-type regions. An isolating box incorporates an orthogonal isolator. The 3-D structure places layers of critical profile normal to the growth axis. The orthogonal isolator can include floating elements. The 3-D semiconductor monolith can be manufactured through continuous or quasicontinuous processing in a closed system, such as through MBE or sputter epitaxy. Also, a thin layer of silicide can be provided as an ohmic contact and/or a thick layer of silicide can be provided as a conductor thereby providing monocrystalline 3-D devices or integrated circuits. Finally, an insulator can be provided about an entire device for isolation.

21 Claims, 13 Drawing Sheets

MONOCRYSTALLINE THREE-DIMENSIONAL INTEGRATED CIRCUIT

CROSS REFERENCES TO CO-PENDING APPLICATIONS

This patent application is a continuation-in-part of U.S. Ser. No. 799,652, filed Nov. 19, 1985, entitled "All-Semiconductor Three-Dimensional Integrated Circuit", now U.S. Pat. No. 4,794,442, 12-27-88.

BACKGROUND OF THE INVENTION

1. Field of the invention — The present invention pertains to monocrystalline three-dimensional integrated devices, and more particularly, pertains to devices containing a 3-D doping pattern forming varied devices and circuits that may be junction-isolated and with interconnecting signal paths and power buses, that also may be junction-isolated, and that may have tunnel junctions connecting N-type to P-type regions.

The present invention also pertains to use of a thin monocrystalline lattice-matched silicide layer as an ohmic contact and/or a thicker such silicide region as a conductor. The monocrystalline devices can also be surrounded by an insulator.

2. Description of the Prior Art — The prior art, such as stacked CMOS, has been concerned with patterning and contouring various materials on the surfaces of semiconductor wafers by using a variety of techniques as a means of achieving more than one layer of circuitry on a substrate.

Prior work in three dimensions has been applied mainly to stacked devices, mostly CMOS, and circuits achieved by complex but largely conventional technologies. The motivation was to have the convenience of insulators for isolation and metals for electrical conduction while taking limited advantage of the third dimension. Numerous problems remain. First, there are reliability penalties because of the interfaces involved. Second and third, there are additional reliability and yield penalties connected with the necessary in-process storage and handling. Fourth, there is the thermal-conductivity penalty. Because power dissipation is already a problem in 2-D circuitry, power dissipation is a greater problem in 3-D circuitry and must be accounted for accordingly. The prior-art stacked approach also included problems of inadequate crystalline quality and control, and inadequate planarity in the advancing free surface. Stacking of largely conventional devices has been nothing more than an evolutionary extension of the existing prior-art processes in stacking semiconductor layers separated by an insulator and involving recrystallized material.

The present invention overcomes the disadvantages of the prior art by providing a monocrystalline three-dimensional integrated circuit. At a given feature size, the 3-dimensional IC provides for greatly increased volumetric densities, as well as improved reliability. Reliability is enhanced by the elimination of interfaces between dissimilar materials. Thermal properties are improved by the exclusion of amorphous material from within the monolith. An amorphous insulator, such as silicon dioxide, has thermal conductivity one hundred times worse than that of silicon. Furthermore, a monocrystalline three-dimensional integrated circuit can be fabricated in a continuous process which minimizes the number of different processing steps and reduces turn-around time. Thin silicide regions also provide for ohmic contacts and thicker silicide layers provide for conductors. An insulator can be provided about each entire device. The silicide and insulator regions combined with semiconductor regions constitute a monocrystalline integrated circuit.

SUMMARY OF THE INVENTION

The object of the present invention is a monocrystalline three-dimensional integrated circuit, containing a 3-D doping pattern forming varied devices and circuits that may be junction-isolated and with interconnecting semiconductor signal paths and power buses, that also may be junction-isolated, usually N+ within P matrix regions, and tunnel junctions (N+ - P+ junctions) or silicide inclusions as ohmic contacts from N-type to P-type regions. The matrix may contain a network of P+ regions to reduce its overall resistance. There are metal-semiconductor contacts are at the outer surfaces. Devices of the present invention may be isolated by an isolating box that surrounds the active portion of the device. The box places back-to-back junctions between the device and the matrix material. To avoid shorting out a device, it may be necessary to interrupt the walls of the box with a thin gap that is normally depleted. This gap provides isolation between the top and bottom of the box and between the inside and outside of the box, thus providing orthogonal isolation.

Other purposes of the present invention include the use of thin monocrystalline lattice-matched silicide layers as ohmic contacts and thicker such silicide regions as conductors. Also, a monocrystalline 3-D device can be surrounded by an insulator. A monocrystalline structure is a combination of two or more materials in lattice-matched single-crystal form. Monocrystalline materials have atoms or groups of atoms positioned at the points of a space lattice. The space lattice is a 3-D configuration of points positioned so that each point has the same arrangement of neighboring points. The monocrystal can also include insulator phases and metallic phases.

The present invention also provides three-dimensional single-crystal devices of enhanced yield, reliability, and volumetric functional density in integrated circuits. The present invention may feature physical sizes that are commonplace in today's 2-D products, and eventually brain-neuron densities can be approached. Two basic structures achieve the present invention. One is a semiconductor monocrystal employing junction isolation, and/or the other is a monocrystal consisting of semiconductor plus lattice-matched metallic phases and/or including matched insulating phases as well.

According to one embodiment of the present invention, there is provided a monocrystalline device with a thin layer of silicide as an ohmic contact and/or a thicker region of silicide as a conductor. A silicon monolith containing a 3-D doping pattern, may or may not also contain metallic and/or insulating regions that are monocrystalline and fully compatible in structure with the semiconductor crystal. This structure is referred to as a monocrystalline 3-D IC.

One significant aspect and feature of the present invention is a monocrystalline three-dimensional integrated circuit which includes optimized path lengths, functional density, and reliability.

Another significant aspect and feature of the present invention is an isolating box incorporating an orthogonal isolator for the semiconductor component or components. The orthogonal isolator can also include floating elements between its major members.

A further significant aspect and feature of the present invention is a device structure that places layers of critical profile normal to the growth axis, the growth axis being identified as the "x" axis.

An additional significant aspect and feature of the present invention is a 3-D IC which lends itself to continuous or quasicontinuous processing.

Other significant aspects and features include the use of silicide in a thin layer as an ohmic contact and/or in a thicker regions as a conductor. The silicide conductor can also be insulated. Many combinations of thin regions, thick layers of conductors and/or insulators can be combined providing for a monocrystalline integrated circuit.

Having thus described the embodiments of the present invention, it is the principal object hereof to provide a monocrystalline three-dimensional integrated circuit. Another principle object is the use of silicide for an ohmic contact in a thin layer or as a conductor in a thicker region.

Objects of the present invention include a monocrystalline three-dimensional integrated circuit including a three-dimensional doping pattern, forming varied devices and circuits that may be insulator-insulated or junction-isolated and with interconnecting signal paths and power buses that, also may be insulator-isolated or junction isolated, and may include tunnel junctions or metallic layers as ohmic contacts from N-type to P-type regions. The semiconductor crystal also may-include isolating boxes incorporating orthogonal isolators. The semiconductor structure places layers of critical profile normal to the growth axis. The orthogonal isolator can also include floating elements. When the semiconductor device employed is the JFET, it can also include an internal gate or gates. There can also be box isolation of the internal-gate devices. Further, there can be pinch-off isolation, at the edge of an internal gate, involving an internal gate thin enough so that the region between the upper and lower channels is normally depleted, as well as orthogonal isolation of the gate edge using U-shaped cross-section regions of same type as channel regions wrapped around the gate-channel edges to provide orthogonal isolation. The semiconductor monolith can also be provided with a coaxial conductor or with one or more conductors within a larger conductor, where here and in the following discussion, "conductor" is construed to mean a heavily doped semiconductor region that simulates metallic properties or an actual metallic phase. Finally, the semiconductor monolith lends itself to specific three-dimensional circuit embodiments. The entire semiconductor monolith can be made through a continuous processing or quasicontinuous processing procedure.

DESCRIPTION OF THE PREFERRED EMBODIMENTS

Figure 1:
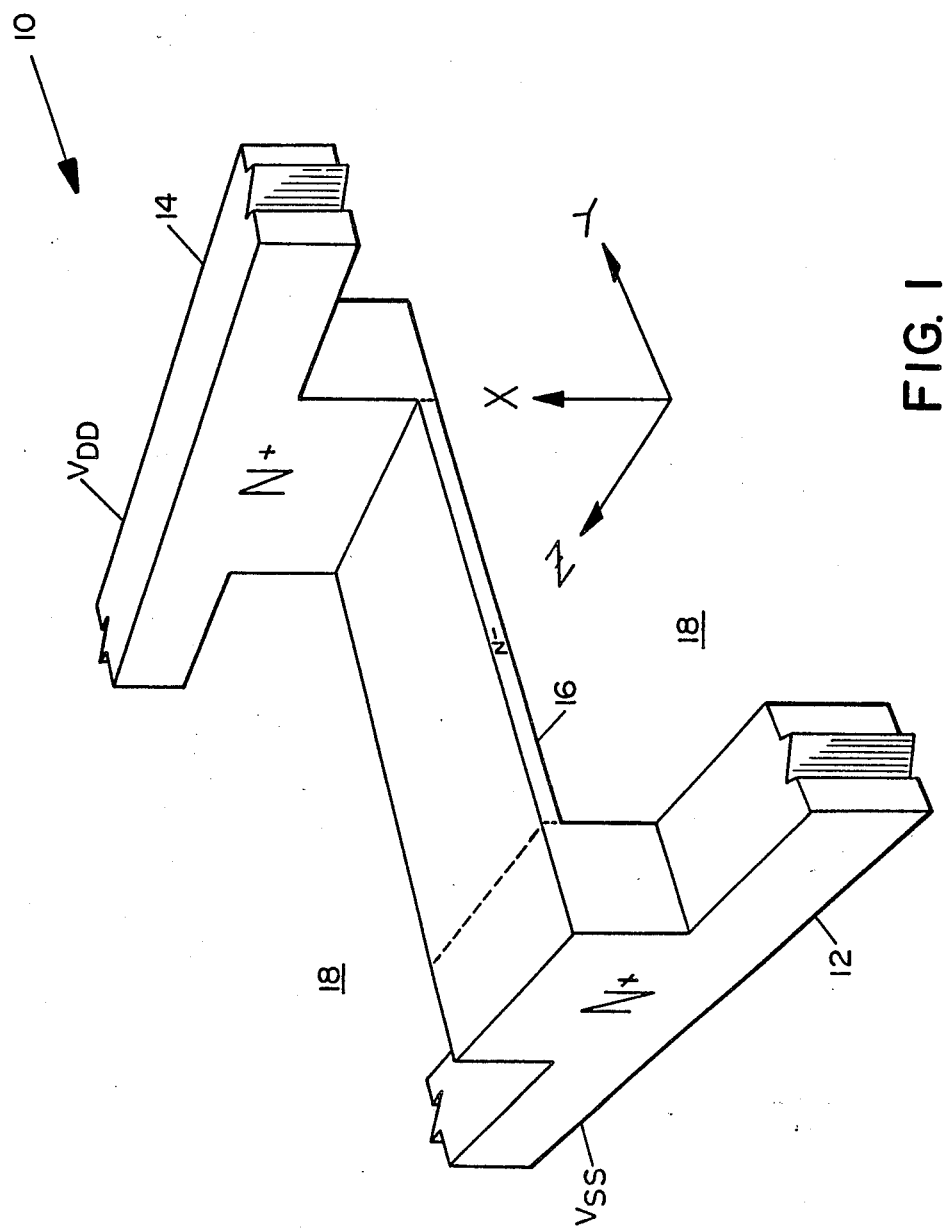
FIG. 1 illustrates a perspective view of a field effect diode.

FIG. 1 illustrates a perspective view of a current-regulating diode device 10 connecting to N+-region conductors 12 and 14. A thin N− region 16 is the channel of the device 10. All of these N-type regions 12–16 are surrounded by a matrix of P− material 18, treated as invisible for sake of brevity and clarity in the figure. All space is P-matrix material, except for those regions which have been numbered. The N+ region 14 is connected to $V_{DD}$ and the N+ region 12 is connected to $V_{SS}$. The elements 12 and 14 can also be referred to as conductors. With voltage applied as indicated, the upper N+ region 14 is isolated from the matrix by a reverse-biased junction, that reverse-biased junction being wherever the region 14 comes into contact with the surrounding P region. The same is applicable to the channel region 16 with reverse bias diminishing as the lower conductor 12 is approached. The largest reverse bias is in region 14, while the smallest reverse-bias is at region 12. The device 10 is structured so that the layers having a critical profile are placed normal to the growth axis x.

Figure 2:
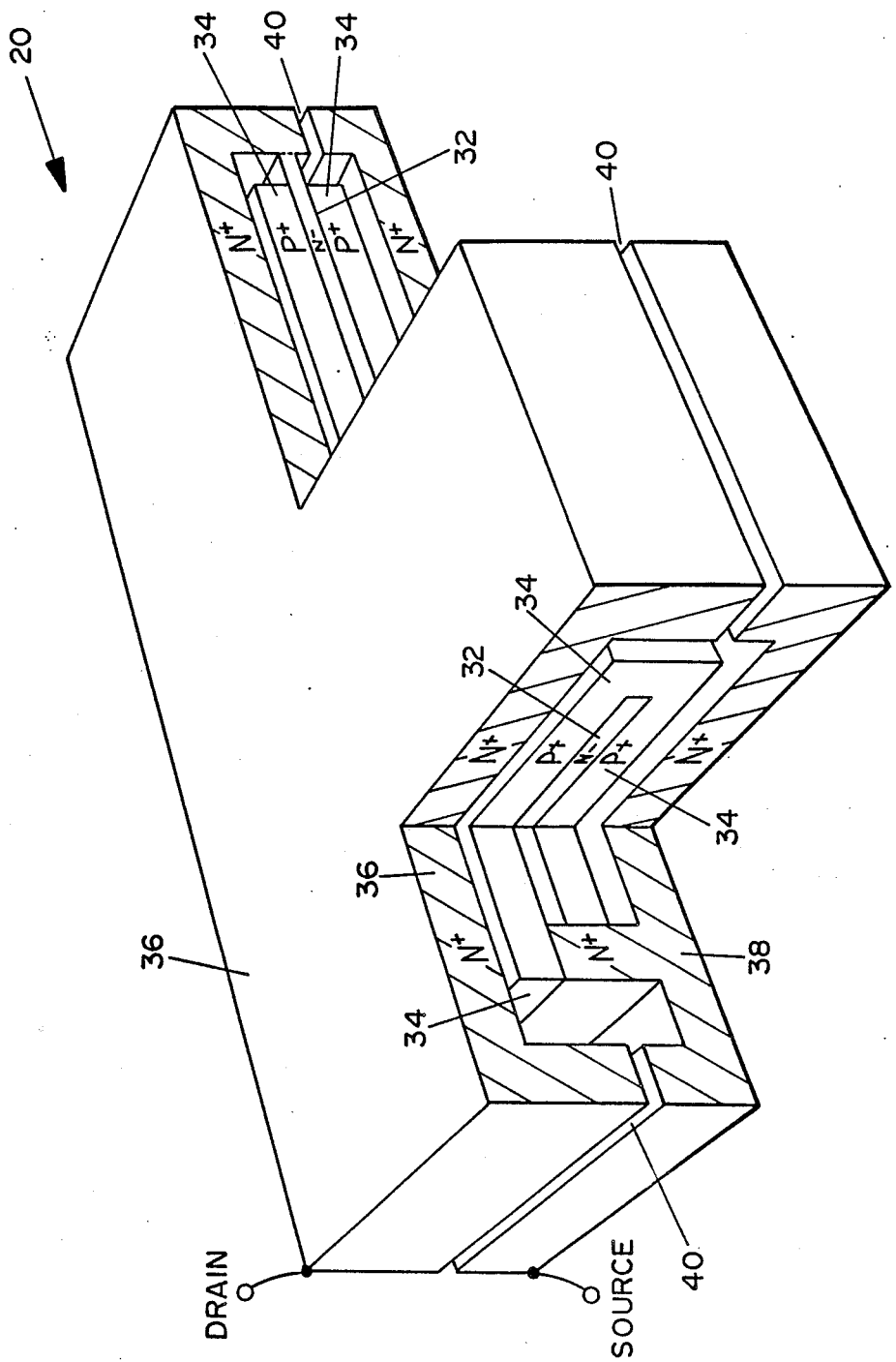
FIG. 2 illustrates a perspective cutaway view of a field-effect diode load device useful in an a monocrystalline three-dimensional integrated circuit (M3DIC)

FIG. 2 illustrates a perspective cutaway view of an a monocrystalline, 3-dimensional integrated device 20, configured as a field-effect diode load device. An N− channel 32 is surrounded by a gate 34 of P+ material. The regions 32 and 34 are also continuous towards the right-hand side of the figure. The regions 32 and 34 are the active parts of the device. The active part of the device is isolated by the top part of the box, N+ material 36 and the bottom part of the box, N+ material 38. The N− material 32 connects the lower portion of the box 38 to the upper portion of the box 36. The N+ layers of material 36 and 38 form the isolation box. Gaps 40, which are continuous about the device, provide for orthogonal isolation. The layers 32 and 34 are suspended within the box and surrounded by P matrix material which has not been labeled on the figure for purposes of clarity and for the sake of brevity in the figure.

Figure 3:
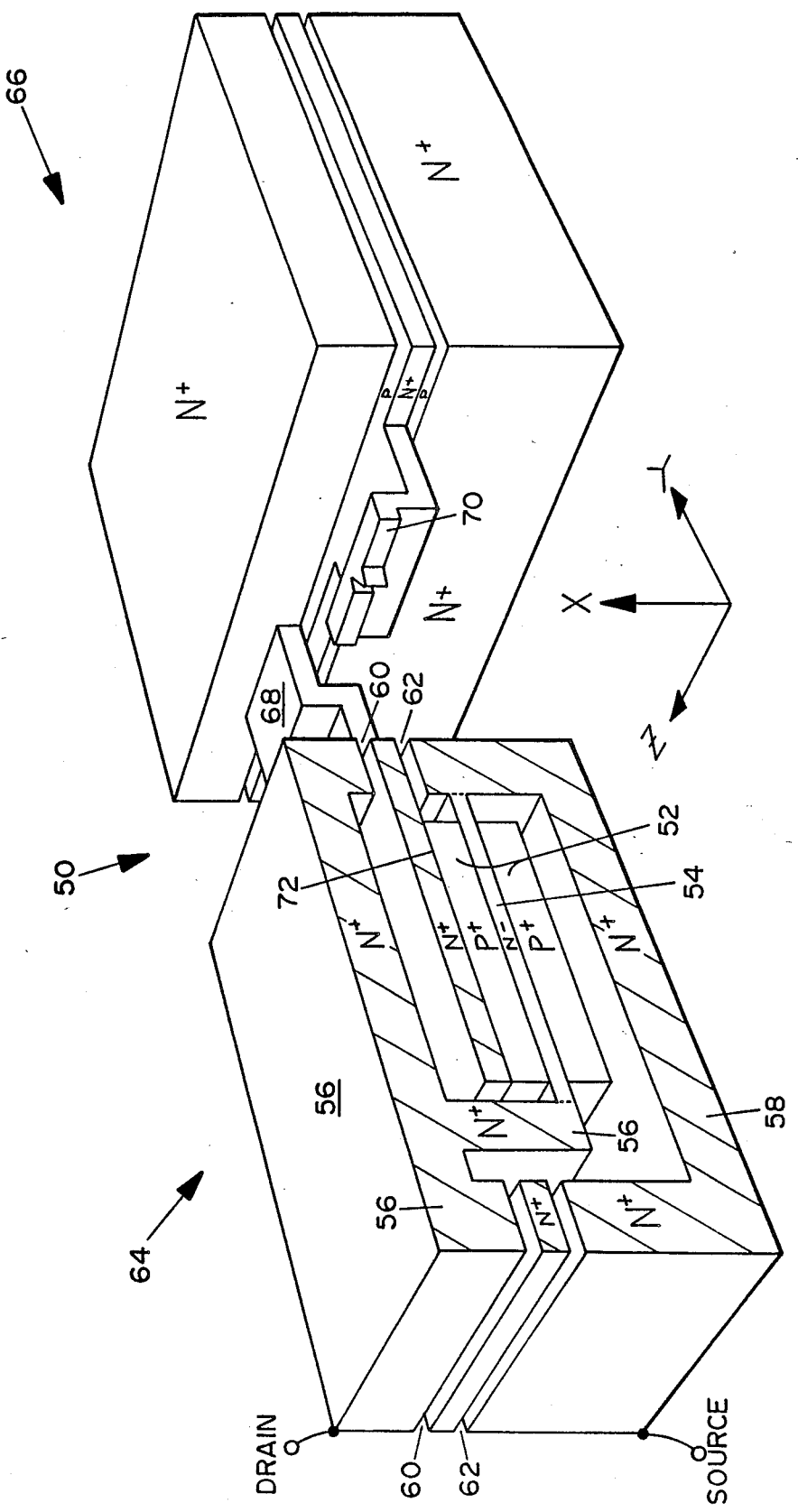
FIG. 3 illustrates a perspective cutaway view of a cross-coupled E-mode JFET pair.

FIG. 3 illustrates a perspective view of a pair of cross-coupled E-mode JFETs partially cut-away. Reference will be subsequently made to FIG. 4 of an Eccles-Jordon flip-flop constructed of enhancement-mode and depletion-mode JFETS. If the P+region were extended out of the paper, the P+region 52 would wrap around the end portion of the N-region 54. In this particular embodiment, two gaps are provided, 60 and 62, which provide for penetrating through the box wall for the cross-coupling elements 68 and 70. P matrix material fills the gaps and has not been illustrated for purposes of clarity and brevity in the figure. The left-hand box 64 of FIG. 3 represents transistor E1 of FIG. 4, and the right hand box 66 of FIG. 3 illustrates the right-hand transistor E2. The layers 68 and 70 provide for cross-coupling accordingly. The junction of the N+ and P+ layers represents a tunnel junction 72. Cross-coupling elements 68 and 70 represent interconnecting signal paths. The FIG. particularly shows layers of critical profile normal to the growth axis X. End layers 56 and 58 illustrate the isolating box, as well as the N+ layers of the left-hand side of FIG. 3.

Figure 4:
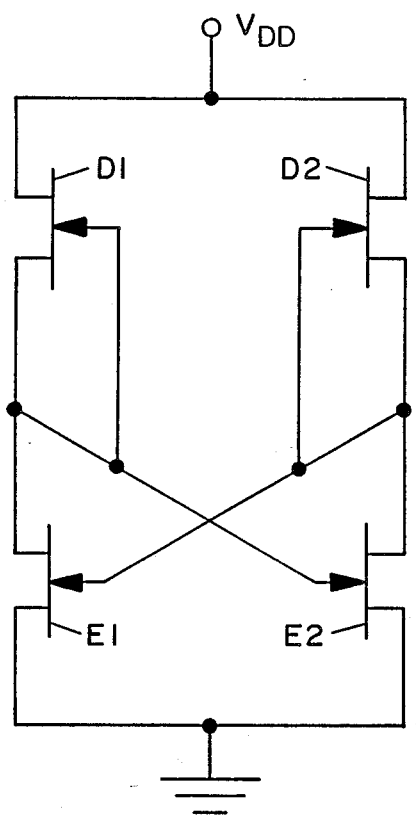
FIG. 4 illustrates an Eccles-Jordan flip-flop constructed of enhancement-mode and depletion-mode JFETS.

FIG. 4 illustrates the electrical circuit schematic for an Eccles-Jordan flip-flop constructed of enhancement-mode JFETs, E1 and E2, and depletion-mode JFETs, D1 and D2. FIG. 3 represents the physical embodiment of the two E-mode JFETs, E1 and E2, in FIG. 4 where all numerals correspond to those elements previously described. The devices of FIGS. 1-4 can be constructed by a single process and within a single processing vessel.

In operation, multilayer JFET-channel devices for the purpose of achieving high transconductance are particularly advantageous because the x dimensions in the isolating box are only slightly increased by increasing the number of channel layers.

Additional features of the devices can include doped regions which consist of a plurality of fractional atomic planes of dopant atoms which can be deposited through a shadow mask. The structure lends itself to a minimal number of metal-semiconductor and dissimilar-material interfaces which are required to implement a desired structure. Of course, all critical dimensions are normal to the growth axis. Junction isolation is provided by the arrangement of the materials themselves. Tunnel junctions as ohmic contacts are provided from N-type to P-type regions. When upper and lower gates are common in an enhancement-mode JFET, the device is useful as a driver. In a JFET with upper and lower gates independent of each other, the punch-through voltage from gate to gate yields a constant-voltage I-V characteristic, useful for level shifting in the M3DIC. In the third, or orthogonal-isolator application, there must be a high enough punch-through voltage in the JFET so as to provide useful gate-to-gate isolation below that value, while simultaneously providing source-to-drain isolation in the orthogonal direction through the normally depleted channel, which provides the orthogonal isolation. A floating element can be introduced into the JFET channel region and between the gate regions, thus increasing the punch-through voltage and thus providing a greater isolating voltage. A JFET with one or more additional floating elements introduced into the channel region and between the gate region, increases the punch-through voltage and thus the isolating voltage. When such a JFET is incorporated into an isolating box that surrounds at least one component of the M3DIC in such a way that one gate is common with the box lid and the other gate is common with the bottom of the box, the dual-gate E-mode JFET is continuous around the periphery of the box, thus achieving simultaneous top-to-bottom isolation and inside-to-outside isolation. When there is at least one additional element lying between the gates and extending around the entire periphery of the box of the JFET, it is thus possible to provide a direct connection of an element inside the box to an element outside the box without loss of the orthogonal isolation.

In an internal-gate JFET, the channel surrounds the gate region, or lies on both sides of it. In a JFET with a gate region between two channel regions, two regions of the same-type material as the channel wrapped around the side edges of the channel-gate structure can provide for orthogonal isolation of the gate region from the surrounding matrix, while also enabling the gate to modulate the conductivity of the entire channel. This is referred to as edge isolation. Another form of edge isolation is called pinch-off isolation. In this case, the gate is thin and the two channel layers extend laterally beyond it, with complete depletion existing between the extending channel layers so that the gate region is isolated from the matrix.

All-depletion-mode circuits can include level shifting by providing a gap in a conductor so that the punch-through phenomena will occur by E-mode devices. The E-mode JFET structure lends itself particularly to orthogonal isolation, exhibits punch through for voltage regulation and level shifting, and provides that the device can be used as an E-mode JFET driver.

Figure 5:
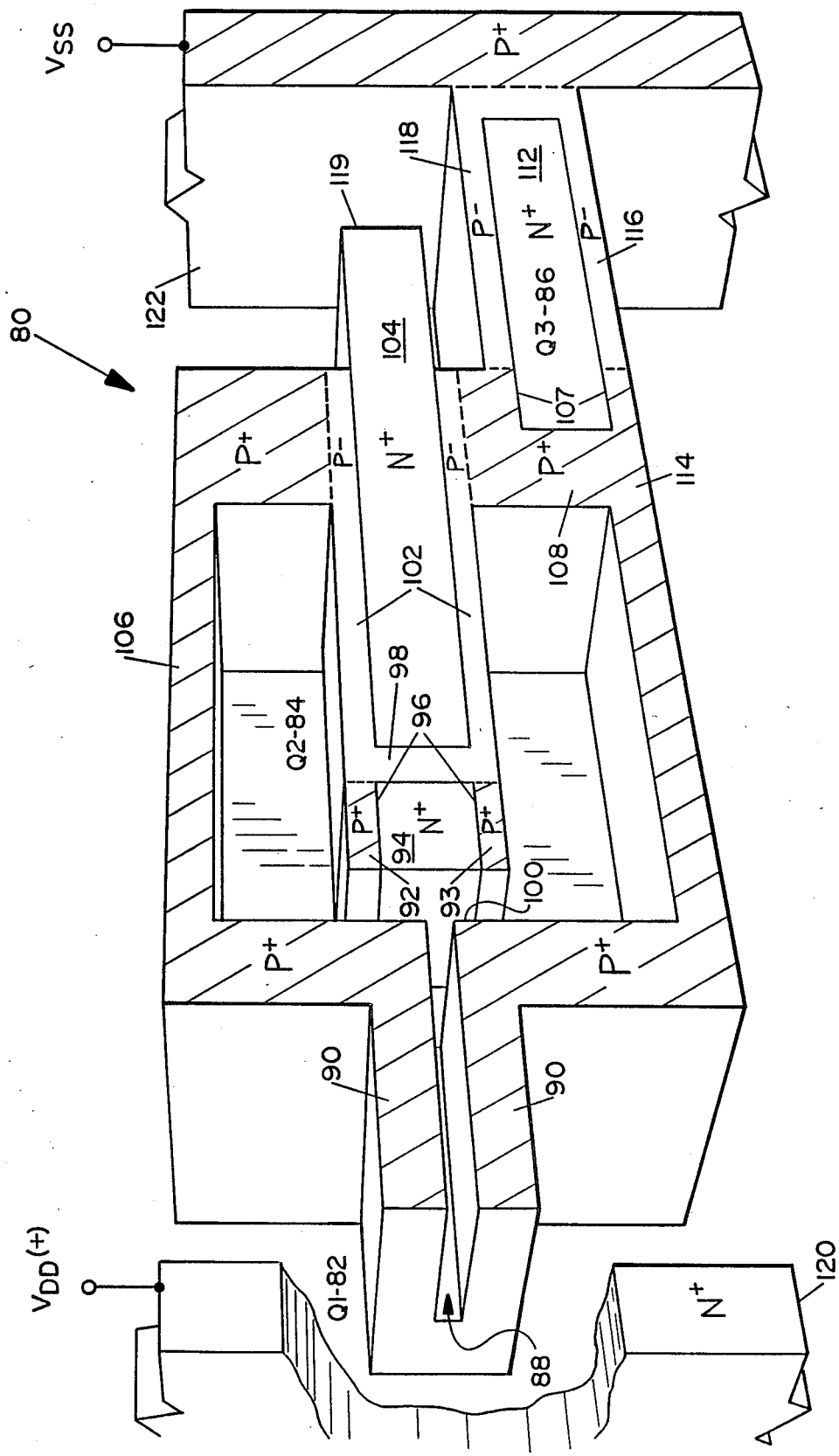
FIG. 5 illustrates a perspective cutaway view of a complementary JFET bistable circuit.
Figure 6:
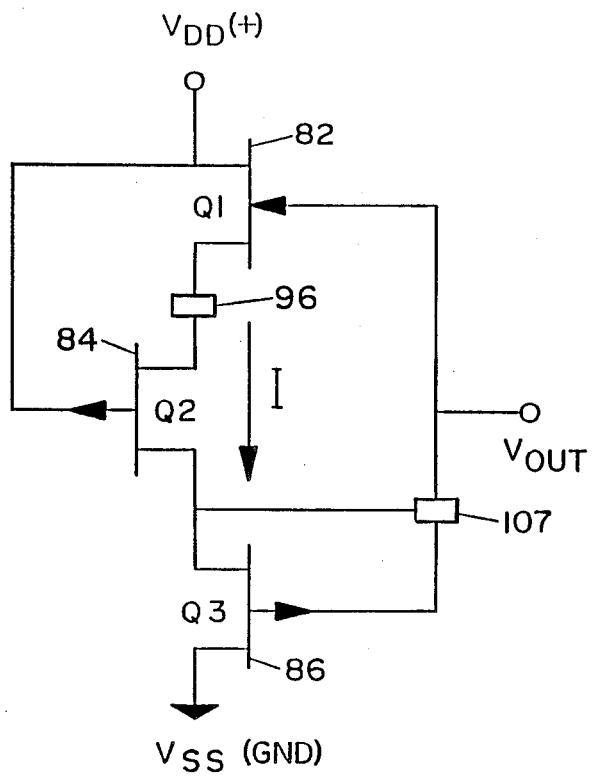
FIG. 6 illustrates a circuit diagram of FIG. 5.

FIG. 5 illustrates a perspective cutaway view of a negative-resistance memory cell 80 without the read or write capabilities. The cell 80 corresponds to the electrical circuit of FIG. 6. The cell 80 includes three different transistors Q1-82, Q2-84, and Q3-86. Transistors Q1 and Q2 form a negative-resistance pair. Transistor Q3 is a depletion-mode load device. This, contrary to the previous figures, illustrates an N-type matrix where the N-type material is invisible for purposes of clarification and sake of brevity in the drawing. The N channel 88 of Q1 is surrounded by P region 90 which is continuous and is symmetric in the plane in which it is cleaved. The P+ regions 92 and 93 and N+ region 94, respectively, illustrate tunnel junctions as ohmic contacts. The tunnel junctions 96 are illustrated in FIG. 6. The N+ region 94 is common with the N material inside of the box of Q2. Region 98 corresponds to the source of Q2. The end of the channel, as well as the region about 100, corresponds to the source of transistor Q1. The thin channel 102 is the active part of transistor Q2 and illustrates the internal gate of Q2. N+ region 104 is an internal gate. A thin P-type region 102 surrounds the N+ region 104. P material 106, a continuation of P material 90, forms a box about the P+ 92, N+ 94 and the N+ 104 material accordingly. The box is designated as 106, but is not shown in totality for purposes of illustration and clarity in the drawings. The region of the P material 90 which surrounds the channel 88 is the gate of Q1. A tunnel junction 107 is formed by the P+ 108 region and the N+ region 112. The gate region 112 is electrically common to a drain region 114 through the tunnel junction, and through the path of P+ 108 and N+ 112 through the tunnel junction 107. The P− region, including channels 116 and 118, wraps around and surrounds the internal gate 112. The end of N+ region 104, that end designated as 119, is at the same potential as a power bus 120, that potential being $V_{DD}$. The P+ region 122 is a bus region. The regions 92 and 94 can be grown side-by-side in lieu of the stacked configuration as illustrated in the figure.

FIG. 6 illustrates a circuit diagram of FIG. 5 where all numerals correspond to those elements previously described.

Figure 7:
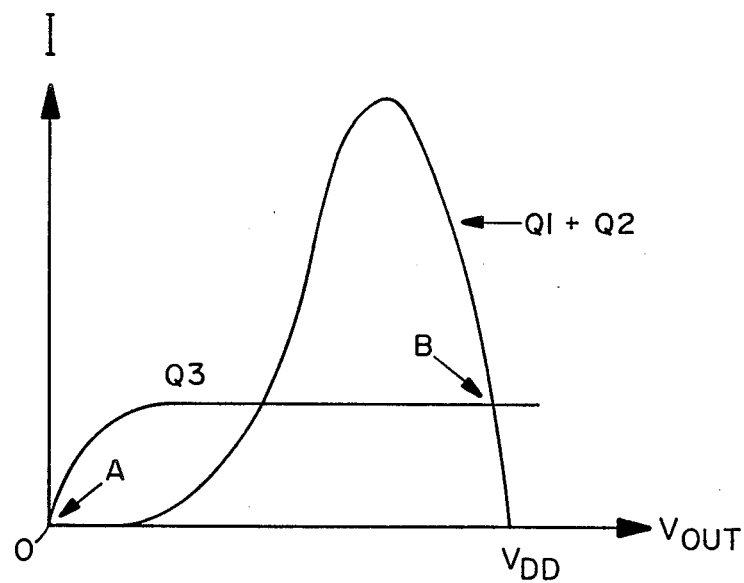
FIG. 7 illustrates an I-V plot of FIG. 6.

FIG. 7 illustrates an I-V diagram of the operation of FIGS. 5 and 6. Points A and B are the voltage-stable points for the circuit.

Figure 8:
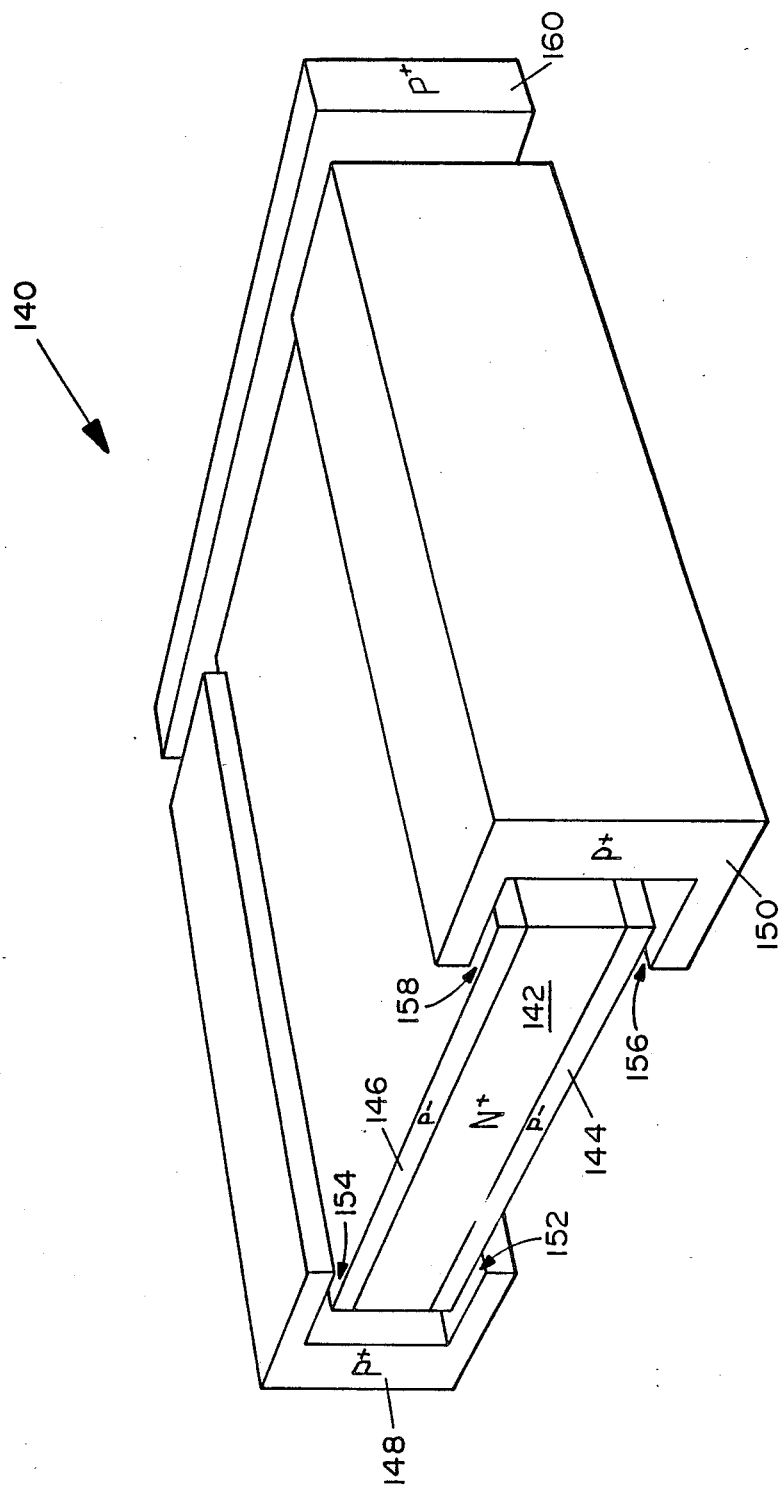
FIG. 8 illustrates orthogonal isolation of a channel edge in an internal-gate device.

FIG. 8 illustrates a perspective view of orthogonal isolation of gate and channel edges in an internal-gate device. An internal-gate JFET 140 includes a gate internal to a channel. The gate 142 is flanked top and bottom by channels 144 and 146. Members 148 and 150 isolate the edges of the gate 142 and channels 144 and 146 accordingly. A plurality of gaps 152, 154, 156, and 158 are provided accordingly. Member 160 connects to the drain ends of the channels. The entire device is surrounded by N— material. The P— regions 144 and 146 and P+ regions 148 and 150 connect to the source. The structure of FIG. 8 is intended to substitute for elements 102 and 104 of FIG. 5 accordingly.

Figure 9:
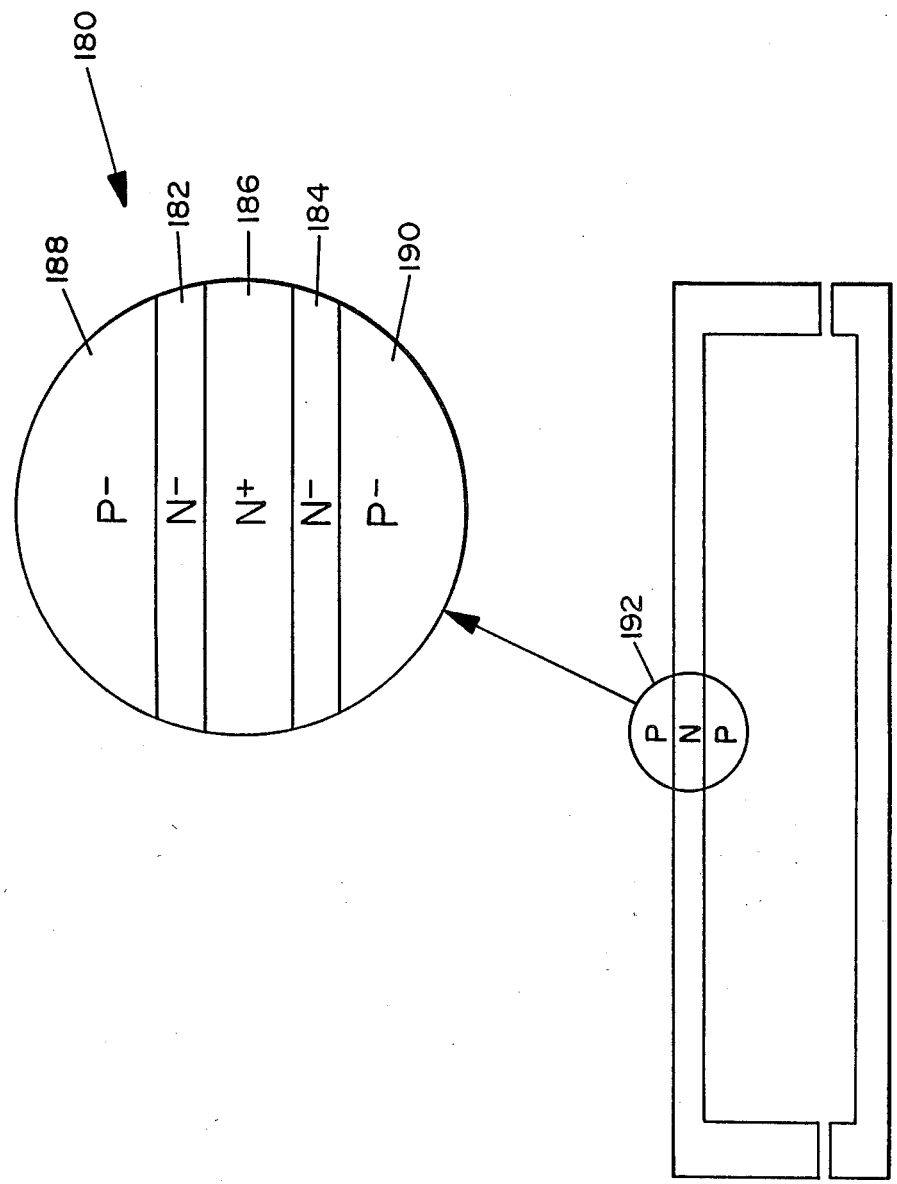
FIG. 9 illustrates a wall-structure variation for diminishing the parasitic capacitance of isolating box junctions.

FIG. 9 illustrates a cross-sectional view of wall structure variations for diminishing parasitic capacitance of isolating-box junctions. The variation 180 includes additional N— layers 182 and 184 above and below the N+ layer 186. The N— regions are surrounded by P— regions 188 and 190. The variation 180 would be substituted in lieu of the P—, N+, and P— region structures 192. The N— regions reduce capacitance while increasing the thickness of the depletion region. The structure of FIG. 9 is intended to replace elements 56 and 58 of FIG. 3 accordingly.

MODE OF OPERATION

The JFET devices of the present invention are described as within a single-crystal semiconductor monolith containing a three-dimensional doping pattern, and also referred to as a monocrystalline three-dimensional integrated circuit (M3DIC). The devices or circuits can be utilized as gate-array devices when put into a three-dimensional array. Further, the devices or circuits can be used in memory applications accordingly.

The vertical dimensions of the devices may be much smaller than the lateral dimensions. It is advantageous to route as many interconnections vertically as possible. Consequently, signal-path lengths are reduced and cross-sectional area of the vertical interconnections can be larger than that of the horizontal connections. This, therefore, minimizes the RC time constants associated with the connection paths.

A typical arrangement would feature cells with a high degree of interconnectivity stacked vertically upon each other, and connected by highly doped semiconductor or metallic-phase conductor regions. Long interconnections, as well as global lines, such as for clocks and buses, could be distributed by metal lines on one or more surfaces of the semiconductor monolith. This is in line with the teachings of the original integrated circuit where metal occurs only external to the monolith. Metal, may be provided for making connections to external circuitry.

The M3DIC technology is invaluable for achieving required storage capacity which is attained quite easily. As an example, let the weighted dimensions (weighted to account for peripheral circuitry) of a memory cell be $20\mu m \times 20\mu m \times 10\mu m$, with the latter being the x or growth direction. This provides $2000 \times 2000 \times 4000 = 16 \times 10^9$ cells in a cube 4 cm on the side.

There is more than sheer capacity. Note that, as far as addressing goes, main memories are of the random-access type while the bulk variety is invariably sequential in nature. This simplifies the example considerably.

Figure 10:
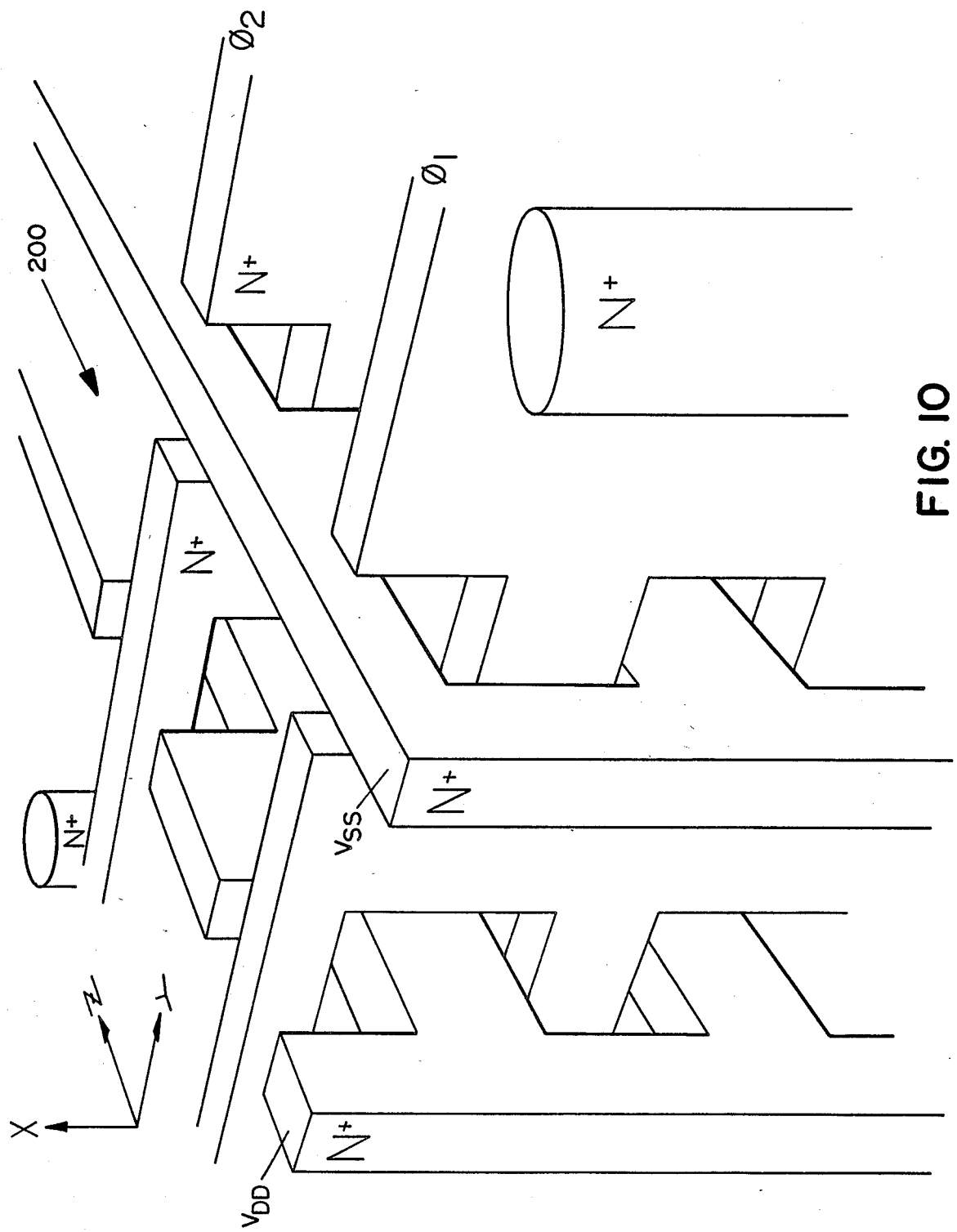
FIG. 10 illustrates a monocrystalline three-dimensional integrated circuit memory (M3DICM)

FIG. 10 illustrates a 3-D memory which can be organized as a large array of shift-register pipes with only two supply lines (the lines being actually "planes") and two clock lines (also being "planes"). Looking at an array from the top, as along the x axis in FIG. 10, one sees one plane of cells and the four buses. Naturally, in three dimensions, there need not be any space conflict among the buses.

Another advantage is where speed is very important. Referring to bulk memories, there are two time constants. One corresponds to the rate at which bits are actually read or written. The other called latency gives the average time it takes to access the required sector. Both are shortened by the 3-D implementation to an order-of-magnitude extent, the first because transistors are much faster than their magnetic counterparts, and the second because access to "pipes" is much simpler than access to "sectors" on a disk.

Taking reliability as a further advantage, there is substantial elimination of microphonics. That in itself makes 3-D integrated circuits unique in bulk storage. For airborne applications and, indeed, in any vibration-prone environment, solid state is the preferred structure.

Data are transferred from "bulk" to "main" memory in blocks. That is why sequential access within bulk is perfectly acceptable. While time is associated with the relatively frequent swaps, a substantial reduction accrues from, for example, GaAs 3-D, because of the ability of GaAs to convert electrical to optical energy. The transfer of data from the "bulk" to "main" memory could be direct, the main memory being mounted on the output face of the bulk memory or, such as through fiber-optic links. A structure with a slot for main memory or peripherals to permit optoelectronic transfer of Input and Output can also be provided. The M3DIC memory converts a maze of circuitry into regular arrays and, thereby, reduces the length and time of travel. This also creates additional naturally intersecting planes for parity checks. The M3DIC alleviates the problems of resistance and voltage drop in power and signal lines because of facilitating fabrication of thicker elements on one hand while reducing distances measured in numbers of squares or cubes on the other.

The $V_{DD}$, $V_{SS}$, $\phi_1$, and $\phi_2$ "planes" of FIG. 10 can be relatively thick to give low sheet resistance. Any point within the cube is no more than a couple of squares away from any input point. In a two-dimensional IC, it is topologically convenient to check parity in a row and column, and a wrong bit at the intersection of the two can thus be corrected. If multiple errors exist in a row or column, however, such cannot be detected unless parity is also checked in an additional dimension. In 2-D this is difficult. In the M3DIC, many more physically-aligned-cell directions exist in which parity can be checked.

In a three-dimensional array of monocrystalline memory cells, the cells can be positioned at sites defined by a space lattice of the crystallographer, which can be by way of example and for purposes of illustration only, but not to be construed as limiting of the present invention, a space lattice of cubic, orthorhombic, monoclinic, triclinic, or other spatial variations thereof. The memory cells provide for checking parity for error detection along lines of physically adjacent cells, where the lines have directions defined by the three primitive vectors of the space lattice involved. This can be pairs such as x-y, y-z, or x-z, by way of example and for purposes of illustration only. Additional directions of checking for parity can also be undertaken. The memory cells can contain parallel layers of a heavily doped semiconductor of a first conductivity type situated in a more lightly doped matrix of a second conductivity type where regularly positioned perforations or openings in the heavily doped layers provide for passage of other conductors through in other directions, such as illustrated in FIG. 10. The semiconductor bulk-storage medium is faster, smaller, lighter, and less sensitive to environment than the prior electromechanical media.

The memory can be provided with an output face for the mounting of a computer main memory. The memory can also include optoelectronic links for mounting on main memory or peripheral subsystems of the main memory. The memory can also include a processor attached to one face, where the processor may include a small main memory. The memory lends itself to be fabricated as a single unit on an all-semiconductor monolith for total-system integration. The memory cell can consist of two E-mode JFET drivers, cross-coupled, and two D-mode JFET loads. The memory cell can also consist of two complementary JFETs, connected to form a negative-resistance pair in series with a load device. The memory can also consist of eight D-mode JFETs and two level-shifting diodes. The memory can also consist of six D-mode JFETs and three voltage-regulating diodes connected in a current-switching configuration.

MONOCRYSTALLINE THREE-DIMENSIONAL INTEGRATED CIRCUIT DEVICES

A monocrystalline device can include combinations of the following four components as set forth in Table 1 below.

Monocrystalline Components

TABLE 1

1. Semiconductor monolith as described in FIGS. 1–10;
2. Thin monocrystalline silicide layer for an ohmic contact, a thin layer being described as a few monolayers with a monolayer amounting usually to a few angstroms;
3. Thick monocrystalline silicide region as a conductor, a thick layer described as a few tenths of a micrometer or more than five hundred angstroms; and,
4. Monocrystalline insulator such as calcium fluoride or like material.

The combinations of components of Table 1 include the following as set forth in Table 2 below.

Combinations of Table 1 Forming Monocrystalline Devices

TABLE 2 a - 1
b - 1 and 2
c - 1 and 3
d - 1 and 4
e - 1, 2 and 3
f - 1, 2 and 4
g - 1, 3 and 4
h - 1, 2, 3 and 4

Figure 11:
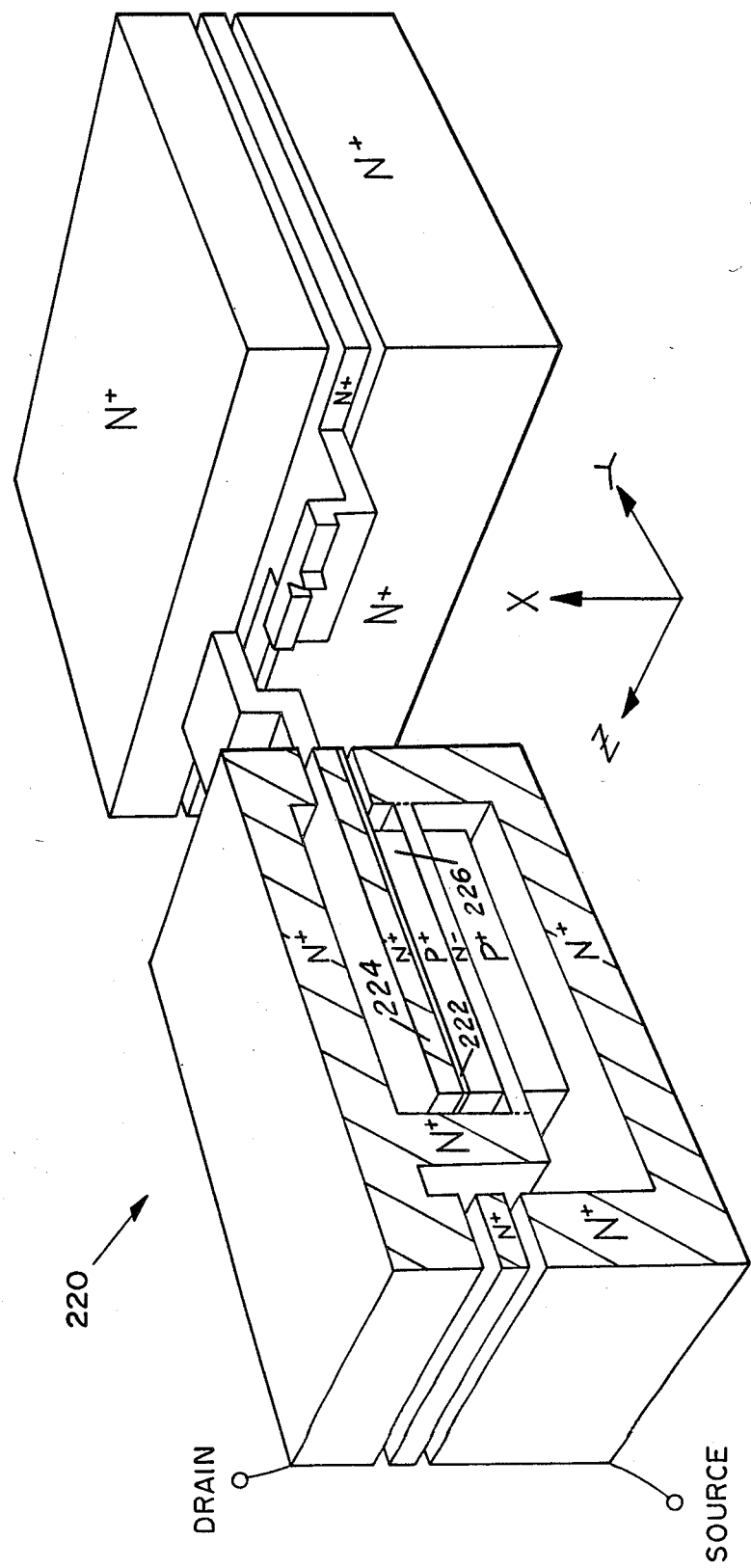
FIG. 11 illustrates a mOnocrystalline device with a silicide layer as an ohmic contact.

FIG. 11 illustrates a perspective cutaway view of a 3-D IC device 220 with a thin silicide layer 222 or like material as an ohmic contact. The layer 222 is positioned between an N+ layer 224 and a P+ layer 226. The structure is referred to as a monocrystalline 3-D IC device. The remaining structure components are those as previously described in FIG. 3. The metallic inclusions employed in single-crystal form to achieve a low-resistance ohmic contact between N-type and P-type regions (probably heavily doped) can provide significant advantages. A key property of a silicide region in such an application is the thickness of the metallic layer necessary to achieve the desired result. If thin sections are adequate, then no step problem is engendered. Plane growth surfaces are favored. If junction isolation is being used, the metallic ohmic contact poses no problems because the ohmic contact can be given an internal location, away from the isolating junction.

Figure 12:
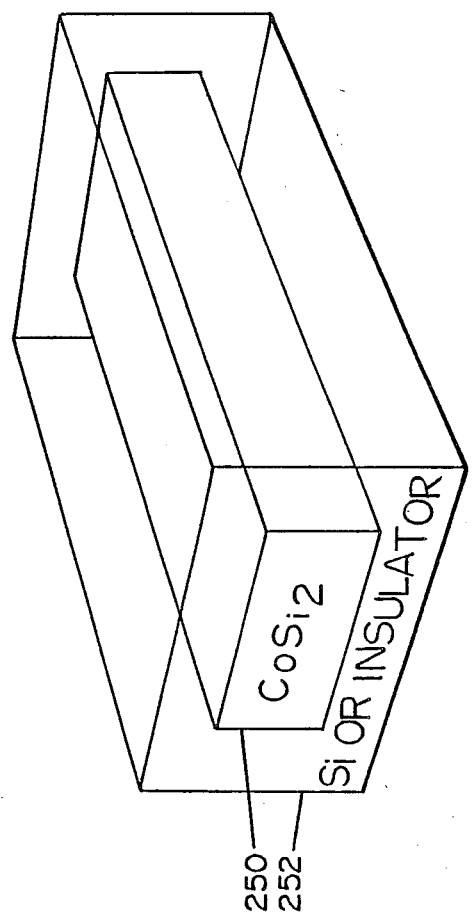
FIG. 12 illustrates a perspective view of a silicide layer as a conductor surrounded by an insulator; and, FIG. 13 illustrates an insulator surrounding a monocrystalline 3-D IC device.

FIG. 12 illustrates a perspective view of a thick silicide region 250 or like material as a conductor which improves conductivity by a factor such as $10^3$. This particular example shows cobalt silicide surrounded by a lightly or heavily doped silicon or insulator 252. Insulators can include calcium fluoride or like insulators.

Using silicides or other metallic phases as conductors, buses and/or signal paths is advantageous, because the most heavily doped monocrystalline silicon that can be achieved exhibits a conductivity about three decades lower than that of a good metallic conductor. This application, however, raises some concerns. Isolation of the conductor is needed. A Schottky barrier formed between the metallic phase and the surrounding "matrix" is one possibility. If this is not advantageous, the metallic phase could be used as a "core" in a doped-silicon conductor, with PN-junction isolation as originally contemplated. Another possibility would be to use a monocrystalline insulator for isolation.

Another area of consideration is the cross-sectional shape of the conductor. Ideally the cross-section should be circular, to minimize surface-to-volume ratio, thus minimizing parasitic-capacitance-to-conductance ratio. A square cross-section would be next best from this point of view, followed by a rectangular cross-section. All of these considerations involve thick metallic sections, which of course raise the consideration of step formations. Silicon and silicide could, though, be grown side by side at approximately equal rates.

Figure 13:
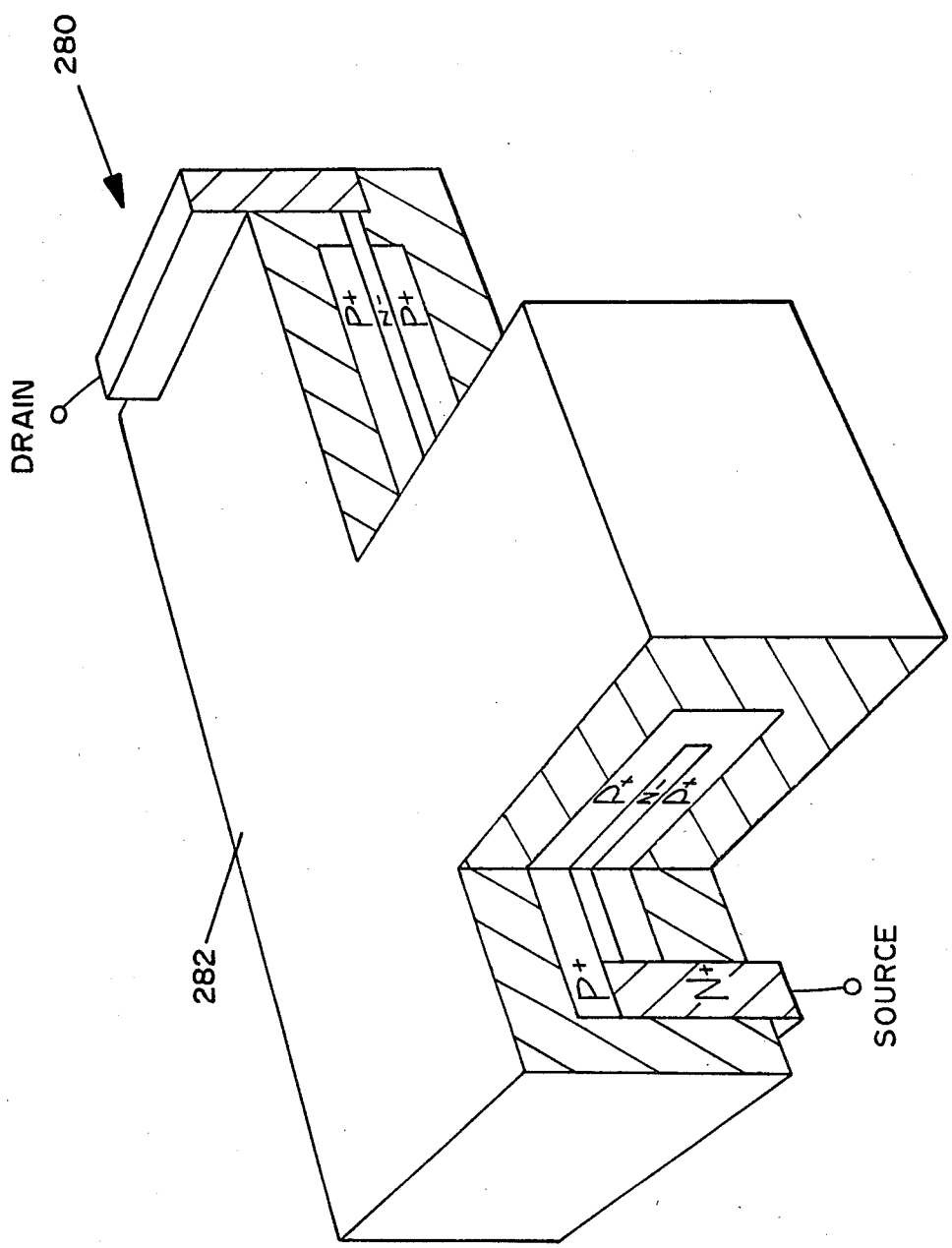

FIG. 13 illustrates a perspective view of a device 280 as a monocrystalline 3-D IC device surrounded by insulator 282 such S calcium fluoride or like material. The insulator is defined as a monocrystalline insulator inclusion. To match a PN junction in capacitance, the insulating section must have a thickness $X(E_i/E_s)$, where X is the junction's depletion-layer thickness, typically a few tenths of a micrometer, $E_i$ is the dielectric permeability of the insulator chosen, and $E_s$ is that of silicon. The use of monocrystalline silicides in silicon structures provides for monocrystalline 3-D structures including a monocrystalline memory cell. Providing the monocrystalline structure with inclusions would provide enhancements with respect to low resistance N-P contacts, low resistance conducting paths and low capacitance isolation. The reliability and thermal conductivity in a monocrystalline monolith are very advantageous as compared to heterogenous structures. The thermodynamic stability of the interfaces between silicon and lattice-matched silicides and/or insulators are far greater than that of interfaces between silicon and amorphous, polycrystalline, or crystallographically mismatched inclusions.

Various modifications can be made to the present invention without departing from the scope thereof. The use of the term circuit singularly also extends to mean circuits in plural. While E-mode JFET has been used as an example, the principles also extend to D-mode JFET devices. Such an example, the E-mode JFET used as a level shifter could include a thicker channel for higher punch-through voltage where the thicker channel operates as a D-mode JFET.

What we claim is:

1. Monocrystalline three-dimensional integrated circuit comprising:
   a. plurality of monocrystalline semiconductor devices forming at least two layers of circuitry;
   b. at least one component from the following group in at least one of said devices;
      (1) region of lattice-matched monocrystalline metallic material as an ohmic contact,
      (2) region of lattice-matched monocrystalline metallic material as an interconnecting conductor in said circuit,
      (3) a lattice-matched monocrystalline insulator substantially surrounding said conductor,
      (4) a lattice-matched monocrystalline insulator substantially surrounding at least one of said devices; and,
   c. a lattice-matched monocrystalline matrix substantially surrounding the components of the monocrystalline three-dimensional integrated circuit.

2. Integrated circuit of claim 1 wherein said ohmic contact is a silicide.

3. Integrated circuit of claim 2 wherein said ohmic contact is at least a few monolayers thick.

4. Integrated circuit of claim 1 wherein said interconnecting layer is from the silicide family.

5. Integrated circuit of claim 4 wherein said interconnecting layer is greater than 500 angstroms.

6. Integrated circuit of claim 1 wherein said conductor is a metallic phase of cobalt disilicide.

7. Integrated circuit of claim 1 wherein said insulator is calcium fluoride.

8. Monocrystalline three-dimensional integrated circuit comprising:
   a. plurality of three-dimensional semiconductor devices buried within a monocrystalline monolith and forming at least two layers of circuitry; and,
   b. at least one component from the following group within at least one of said devices:
      (1) a region of nonconducting material in at least one of said devices,
      (2) a region of nonconducting material substantially surrounding at least one of said devices,
      (3) a region of nonconducting material substantially surrounding an electrical interconnection lead,
      (4) a region of buried metallic material forming an electrode in at least one of said devices,
      (5) a region of metallic material forming an ohmic contact to at least one semiconductor region,
      (6) a region of metallic material forming an electrical interconnection lead.

9. Integrated circuit of claim 8 wherein said nonconducting material is a semi-insulating semiconductor.

10. Integrated circuit of claim 8 wherein said nonconducting material is a lattice-matched insulator.

11. Integrated circuit of claim 8 wherein said metallic material is a lattice-matched conductor.

12. Integrated circuit of claim 11 wherein said metallic material is in the silicide family.

13. Integrated circuit of claim 11 wherein said metallic material is cobalt disilicide.

14. The three-dimensional monolith of claim 1 comprising at least one buried BJT with a collector region inside the base region.

15. A three-dimensional monolith of claim 1 comprising at least one buried, three-dimensional merged FET in combination with other three-dimensional devices.

16. Monocrystalline three-dimensional integrated circuit comprising:
   a. plurality of monocrystalline semiconductor devices;
   b. at least one component from the following group in at least one of said devices;
      (1) layer of silicide material as an ohmic contact in said device,
      (2) region of silicide material as an interconnecting conductor in said integrated circuit,
      (3) an insulator substantially surrounding said conductor,
      (4) an insulator substantially surrounding at least one of said devices; and,
   c. single-crystal matrix surrounding said devices thereby completing the monolith of said three-dimensional substantially monocrystalline integrated circuit.

17. Monocrystalline three-dimensional integrated circuit comprising:
   a. plurality of monocrystalline semiconductor devices;
   b. at least one component from the following group in at least one of said devices;
      (1) few monolayers of silicide material as an ohmic contact in said device,
      (2) region of silicide material as an interconnecting conductor in said integrated circuit,
      (3) an insulator substantially surrounding said conductor,
      (4.) an insulator substantially surrounding at least one of said devices; and,
   c. single-crystal matrix surrounding said devices thereby completing the monolith of said three-dimensional substantially monocrystalline integrated circuit.

18. Monocrystalline three-dimensional integrated circuit comprising:
   a. plurality of monocrystalline semiconductor devices;
   b. at least one component from the following group in at least one of said devices;
      (1) layer of material as an ohmic contact in said device,
      (2) region of silicide material as an interconnecting conductor in said integrated circuit,
      (3) an insulator substantially surrounding said conductor,
      (4) an insulator substantially surrounding at least one of said devices; and,
   c. single-crystal matrix surrounding said devices thereby completing the monolith of said three-dimensional substantially monocrystalline integrated circuit.

19. Monocrystalline three-dimensional integrated circuit comprising:
   a. plurality of monocrystalline semiconductor devices;

b. at least one component from the following group in at least one of said devices;
  (1) layer of material as an ohmic contact in said device,
  (2) region of material not more than 500 angstroms thick as an interconnecting conductor in said device,
  (3) an insulator substantially surrounding said conductor, or
  (4) an insulator substantially surrounding at least one of said devices; and,
c. single-crystal matrix surrounding said devices thereby completing the monolith of said three-dimensional monocrystalline integrated circuit.

20. Monocrystalline three-dimensional integrated circuit comprising:
a. plurality of monocrystalline semiconductor devices;
b. at least one component from the following group in at least one of said devices;
  (1) layer of cobalt disilicide as an ohmic contact in said device,
  (2) region of cobalt disilicide material as an interconnecting conductor in said device,
  (3) an insulator substantially surrounding said conductor, or
  (4) an insulator substantially surrounding at least one of said devices; and,
c. single-crystal matrix surrounding said devices thereby completing the monolith of said three-dimensional monocrystalline integrated circuit.

21. Monocrystalline three-dimensional integrated circuit comprising:
a. plurality of monocrystalline semiconductor devices;
b. at least one component from the following group in at least one of said devices;
  (1) layer of material as an ohmic contact in said device,
  (2) region of material as an interconnecting conductor in said device,
  (3) an insulator of calcium fluoride substantially surrounding said conductor,
  (4) an insulator substantially surrounding at least one of said devices; and,
c. single-crystal matrix surrounding said devices thereby completing the monolith of said three-dimensional monocrystalline integrated circuit.

* * * * *

UNITED STATES PATENT AND TRADEMARK OFFICE
CERTIFICATE OF CORRECTION

PATENT NO. : 4,885,615

DATED : December 5, 1989

INVENTOR(S) : Raymond M. Warner, Jr. et al

It is certified that error appears in the above-identified patent and that said Letters Patent is hereby corrected as shown below:

In the Abstract

Page 1, delete entire Abstract and insert new Abstract which was entered through Amendment filed February 14, 1989.

--ABSTRACT OF THE DISCLOSURE

A single-crystal monolith contains a 3-D doping pattern in its semiconductor portion forming varied devices and circuits that are either junction-isolated or insulator-isolated. The monolith includes interconnecting signal paths and power buses that are either heavily doped semiconductor regions or metallic regions, and that are also either junction-isolated or insulator-isolated. The monolith also contains ohmic contacts from N-type to P-type regions that are either tunnel junctions ($N^+$-$P^+$ junctions) or metallic regions. With the continuous monolith an insulator can substantially surround a device for isolation.

UNITED STATES PATENT AND TRADEMARK OFFICE
CERTIFICATE OF CORRECTION

PATENT NO. : 4,885,615

DATED : December 5, 1989

INVENTOR(S) : Raymond M. Warner, Jr. et al

It is certified that error appears in the above-identified patent and that said Letters Patent is hereby corrected as shown below:

The 3-D structure places regions of critical profile normal to the growth axis. These rgions and other regions need not be continuous layers. The 3-D monolith can be manufactured in a closed system through continuous or quasicontinuous processing, such as MBE or sputter epitaxy. Also, a lattice-matched monocrystalline silicide can constitute the metallic regions cited above, and lattice-matched monocrystalline calcium fluoride can constitute the insulator regions cited above. A 3-D array of memory cells permits multiaxis parity checks to correct burst errors, as well as the simultaneous readout of a two-dimensional array of data from the memory array.--

Column 3, line 32 delete "may-include" and insert --may include--.

UNITED STATES PATENT AND TRADEMARK OFFICE
CERTIFICATE OF CORRECTION

PATENT NO. : 4,885,615

DATED : December 5, 1989

INVENTOR(S) : Raymond M. Warner, Jr. et al

It is certified that error appears in the above-identified patent and that said Letters Patent is hereby corrected as shown below:

Column 4, line 12, delete "mOnocrystalline" and insert --monocrystalline--.

Column 4, line 42, delete "an".

Column 8, line 1, delete "Which" and insert --which--

Signed and Sealed this

Twenty-sixth Day of February, 1991

Attest:

HARRY F. MANBECK, JR.

Attesting Officer

Commissioner of Patents and Trademarks